US011611426B2

(12) United States Patent
Kunchapu et al.

(10) Patent No.: US 11,611,426 B2
(45) Date of Patent: Mar. 21, 2023

(54) MULTI-LANE TRANSMITTING APPARATUS AND METHOD OF PERFORMING A BUILT-IN SELF-TEST IN THE MULTI-LANE TRANSMITTING APPARATUS

(71) Applicant: SAMSUNG ELECTRONICS CO., LTD., Suwon-si (KR)

(72) Inventors: Nageswara Rao Kunchapu, Bengaluru (IN); Tamal Das, Bengaluru (IN); Akshay Karkal Kamath, Bengaluru (IN); Mohit Arora, Bengaluru (IN)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/470,334

(22) Filed: Sep. 9, 2021

(65) Prior Publication Data
US 2022/0329405 A1    Oct. 13, 2022

(30) Foreign Application Priority Data

Apr. 1, 2021    (IN) .............................. 202141015630

(51) Int. Cl.
| | | |
|---|---|---|
| H04L 7/00 | (2006.01) | |
| H04L 25/00 | (2006.01) | |
| H04L 25/40 | (2006.01) | |

(52) U.S. Cl.
CPC .......... H04L 7/0037 (2013.01); H04L 7/0054 (2013.01)

(58) Field of Classification Search
CPC ... H04L 7/0037; H04L 7/0054; H04L 7/0016; H04L 1/244; H04L 1/243

USPC ................................ 375/371, 373, 226, 224
See application file for complete search history.

(56) References Cited

U.S. PATENT DOCUMENTS

| | | |
|---|---|---|
| 8,037,377 B1 | 10/2011 | Chia et al. |
| 9,042,431 B1* | 5/2015 | Yadavalli ................ H04L 1/243 |
| | | 375/221 |
| 9,100,112 B1 | 8/2015 | Leong et al. |
| 2004/0047408 A1* | 3/2004 | Koenenkamp .......... H04L 1/244 |
| | | 375/224 |
| 2008/0016421 A1 | 1/2008 | McDevitt |
| 2015/0229467 A1* | 8/2015 | Lee ....................... H04L 7/0016 |
| | | 375/371 |

* cited by examiner

*Primary Examiner* — Phuong Phu
(74) *Attorney, Agent, or Firm* — F. Chau & Associates, LLC

(57) ABSTRACT

A multi-lane transmitting apparatus includes lanes, and each lane includes a serializer circuit to convert parallel bits to serial bits. A clock signal generator generates a first clock signal having phases. A deserializer circuit converts serial bits to parallel bits. A Built-In Self-Test (BIST) circuit includes a signal generator circuit for generating a signal having bits in a defined pattern. A comparator circuit compares a pattern of bits of an output signal with the defined pattern. A BIST lane circuit monitors a status of the lanes. A BIST central circuit receives the status and determines if a number of lanes having an unmatched status is less than a threshold value. A phase extrapolator circuit adjusts a phase of the first clock signal when the number of the lanes is less than the threshold value.

20 Claims, 7 Drawing Sheets

MULTI-LANE TRANSMITTING APPARATUS AND METHOD OF PERFORMING A BUILT-IN SELF-TEST IN THE MULTI-LANE TRANSMITTING APPARATUS

CROSS-REFERENCE TO RELATED APPLICATION

This application claims priority under 35 U.S.C. § 119 to Indian Patent Application No. 202141015630 filed Apr. 1, 2021, the disclosure of which is incorporated by reference herein in its entirety.

TECHNICAL FIELD

Exemplary embodiments of the inventive concept relate to a multi-lane transmitting apparatus for serial interface applications, and more particularly, to a method of performing a Built-In Self-Test (BIST) in the multi-lane transmitting apparatus.

DISCUSSION OF RELATED ART

High-speed transmitting apparatuses are used in serial interface applications for converting parallel data to serial data. Many applications ranging from display devices to wireless infrastructure transceivers use high speed serial interfaces for serializing parallel data (typically ranging in the order of Mbps/Gbps). Existing high-speed transmitting apparatuses include a plurality of lanes (data lanes) in a Physical layer (PHY), where each lane is capable of serializing the parallel data at high speed.

Transmitting apparatuses have to be tested for their serializing and transmitting performance. When testing an Integrated Circuit (IC), there may be limited technician accessibility or a cost of testing during manufacture. A Built-In Self-Test (BIST) is a mechanism that permits the IC to test itself. BIST increases reliability of the IC. The main purpose of BIST is to reduce the complexity of testing the IC and lower repair cycle times, thus decreasing the cost and reducing reliance upon external test equipment. Generally, output of a transmitter is provided to the input of a receiver to test the functionality of the IC. The constraint in implementing the BIST in a multi-lane transmitting apparatus is that the multi-lane transmitting apparatus does not have a built-in receiving apparatus. In traditional techniques, a test receiver is used for performing the BIST. The additional circuitry increases the IC development as well as testing cost.

SUMMARY

In an exemplary embodiment of the inventive concept, a multi-lane transmitting apparatus includes a plurality of lanes, a clock signal generator, a plurality of deserializer circuits, and a Built-In Self-Test (BIST) circuit. Each lane of the plurality of lanes includes a serializer circuit configured to convert parallel bits to serial bits. The clock signal generator is configured to generate a first clock signal having a plurality of phases. The first clock signal is provided to the plurality of lanes. Each of the plurality of deserializer circuits is configured between two lanes of the plurality of lanes to convert serial bits to parallel bits. The BIST circuit is configured to test the multi-lane transmitting apparatus. The BIST circuit includes a plurality of signal generator circuits, a plurality of comparator circuits, a plurality of BIST lane circuits, a BIST central circuit, and a plurality of phase extrapolator circuits. Each of the plurality of signal generator circuits is configured between two lanes of the plurality of lanes to generate a signal having bits in a defined pattern and provide the signal corresponding to each of the plurality of phases of the first clock signal sequentially to a corresponding two lanes of the plurality of lanes. Each of the plurality of comparator circuits is configured between the two lanes of the plurality of lanes to compare a pattern of bits of an output signal from each of a corresponding two lanes with a defined pattern, for each of the plurality of phases of the first clock signal. An output of each of the plurality of comparator circuits indicates a matched status or an unmatched status of the pattern of bits of the output signal. Each of the plurality of BIST lane circuits is configured between two lanes of the plurality of lanes to monitor a status of each of a corresponding two lanes based on the output of a corresponding comparator circuit. The BIST central circuit is configured to receive a status of the plurality of lanes from the plurality of BIST lane circuits, determine one or more lanes from the plurality of lanes and a corresponding phase among the plurality of phases of the first clock signal having the unmatched status, and determine if a number of the one or more lanes is less than a threshold value. Each of the plurality of phase extrapolator circuits is configured between two lanes of the plurality of lanes to adjust the phase of the first clock signal provided to the one or more lanes when the number of the one or more lanes is less than the threshold value. The phase of the first clock signal provided to the one or more lanes is adjusted according to a delay calibrated in the one or more lanes.

In an exemplary embodiment of the inventive concept, a method for testing a multi-lane transmitting apparatus is provided. The multi-lane transmitting apparatus includes a plurality of lanes, a clock signal generator, and a Built-In Self-Test (BIST) circuit. The method includes generating, by the clock signal generator, a first clock signal having a plurality of phases. The first clock signal is provided to the plurality of lanes. Further, the method includes generating, by a plurality of signal generator circuits, a signal having bits in a defined pattern and providing the signal and each of the plurality of phases of the first clock signal to the plurality of lanes sequentially. Furthermore, the method includes comparing, by a plurality of comparator circuits, a pattern of bits of an output signal from each lane of the plurality of lanes with the defined pattern, for each of the plurality of phases of the first clock signal. An output of each of the plurality of comparator circuits indicates a matched status or an unmatched status of the pattern of bits of the output signal. Furthermore, the method includes monitoring, by a plurality of BIST lane circuits, the status of each of two lanes of the plurality of lanes based on the output of the plurality of comparator circuits. Each of the plurality of BIST lane circuits is configured between two lanes of the plurality of lanes. Moreover. the method includes receiving, by a BIST central circuit, the status of the plurality of lanes from the plurality of BIST lane circuits, determining one or more lanes from the plurality of lanes having the unmatched status and a corresponding phase among the plurality of phases of the first clock signal, and determining if a number of the one or more lanes is less than a threshold value. Thereafter, the method includes calibrating, by a respective phase extrapolator circuit among a plurality of phase extrapolator circuits, a delay in the one or more lanes, to adjust a phase of the first clock signal provided to the one or more lanes when the number of one or more lanes is less than the threshold value. The phase of the first clock signal provided to the one or more lanes is adjusted.

In an exemplary embodiment of the inventive concept, a method for testing a multi-lane transmitting apparatus is provided. The multi-lane transmitting apparatus includes a plurality of lanes and a Built-In Self-Test (BIST) circuit including a plurality of BIST lane circuits. Each of the plurality of BIST lane circuits is connected between two of the plurality of lanes. The method includes selecting a first phase of a plurality of phases of a first clock signal, and providing the first phase to the plurality of lanes, performing align detection to determine if each of the plurality of lanes has a matched status or an unmatched status, and receiving a status of the plurality of lanes from the plurality of BIST lane circuits, determining if a number of the plurality of lanes having the unmatched status is less than a threshold value, where each of the plurality of lanes having the unmatched status is a fail lane, performing delay calibration for the fail lanes if a number of the fail lanes is less than the threshold value, performing a BIST if the delay calibration for the fail lanes passes, and selecting a next phase of the plurality of phases, providing the next phase to the plurality of lanes, and performing the align detection, the delay calibration if the number of the fail lanes is less than the threshold value, and the BIST if the delay calibration passes.

BRIEF DESCRIPTION OF THE DRAWINGS

The above and other features of the inventive concept will be more clearly understood by describing in detail exemplary embodiments thereof with reference to the accompanying drawings.

DETAILED DESCRIPTION OF THE EMBODIMENTS

Exemplary embodiments of the inventive concept relate to implementing a Built-In Self-Test (BIST) in a multi-lane transmitting apparatus. The BIST is implemented by providing a high-speed clock signal of different phases with a predefined patterns (parallel bits) to each lane of the multi-lane transmitting apparatus. Each lane includes a serializer circuit. The serializer circuit serializes the parallel bits. A deserializer circuit is used to convert the serialized data back into parallel data, which is fed to a comparator circuit. The comparator circuit compares an output of the deserializer circuit with the predefined patterns, and determines a phase of the high-speed clock signal for which maximum lanes have passed. When the maximum lanes have passed for a certain phase, failed lanes are identified. Further, such identified lanes are phase calibrated. Therefore, the BIST implementation may be performed without the need of receiver.

Figure 1:
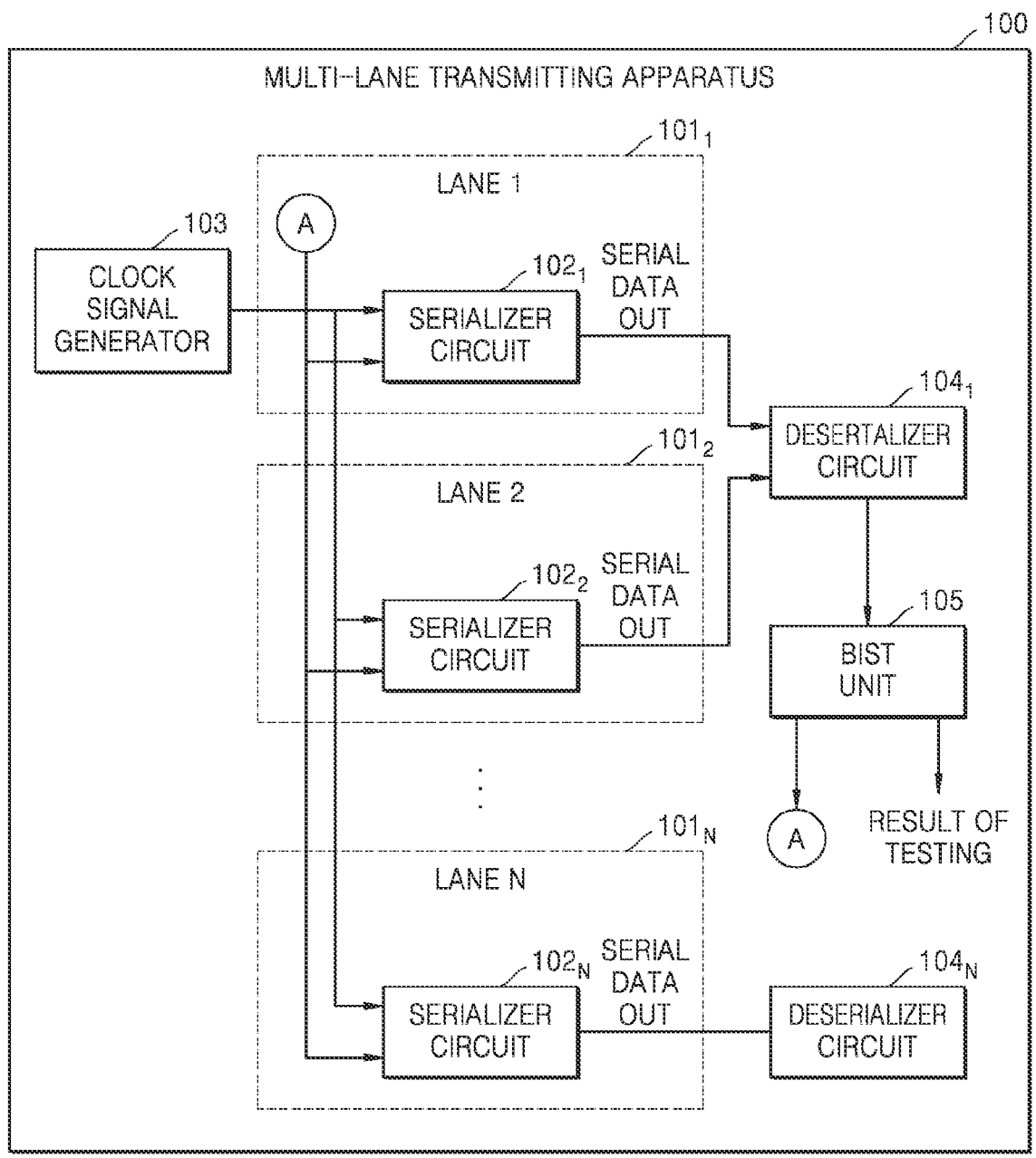
FIG. 1 shows a simplified block diagram of a multi-lane transmitting apparatus, in accordance with an exemplary embodiment of the inventive concept.

FIG. 1 shows a simplified block diagram of a multi-lane transmitting apparatus, in accordance with an exemplary embodiment of the inventive concept. In an exemplary embodiment of the inventive concept, a multi-lane transmitting apparatus 100 is a serializer deserializer (SERDES) transmitter. The multi-lane transmitting apparatus 100 can follow serial interface standards including, but not limited to, High-Definition Multimedia Interface (HDMI), Display Port (DP), Universal Serial Bus (USB) type-C, or any other standards including multi-lane high-speed parallel to serial conversion. A person skilled in the art should acknowledge that the inventive concept can be applied in different applications, like televisions (TV), laptops, tablets, or any other electronic appliance having a parallel to serial interface for serializing data. Exemplary embodiments of the inventive concept can be incorporated into various types of communication systems, such as intra-computer data transmission structures (e.g., Peripheral Component Interconnect (PCI) express bus), telecommunication networks, Local Area Networks (LAN), Wireless Local Area Networks (WLAN), wired and wireless point-to-point connections, optical data transmission systems, or other types of communication systems using SERDES transmitters. A physical (PHY) layer of the multi-lane transmitting apparatus 100 may include a plurality of lanes (lane 1 $101_1$, ... lane n $101_N$), a plurality of serializer circuits $102_1$, $102_2$, ... $102_N$, a clock signal generator 103, a deserializer circuit, and a BIST unit 105. According to an exemplary embodiment of the inventive concept, the BIST unit 105 may be a circuit.

In an exemplary embodiment of the inventive concept, the multi-lane transmitting apparatus 100 may have N lanes, where N can be greater than or equal to 2. Each lane of the plurality of lanes $101_1$, $101_2$, ... $101_N$ includes a respective serializer circuit (e.g., serializer circuit $102_1$ of lane 1 $101_1$). In an exemplary embodiment of the inventive concept, each lane may receive P parallel bits and convert the P parallel bits into serial bits. The plurality of serializer circuits $102_1$, $102_2$, ... $102_N$ use a parallel clock to convert the P bits into serial bits. In an exemplary embodiment of the inventive concept, the plurality of serializer circuits $102_1$, $102_2$, ... $102_N$ may receive 8-bit parallel input. In an exemplary embodiment of the inventive concept, the plurality of serializer circuits $102_1$, $102_2$, ... $102_N$ may receive 16-bit parallel input. In an exemplary embodiment of the inventive concept, the serializer circuit $102_1$, $102_2$, ... $102_N$ may receive 12-bit parallel input. In an exemplary embodiment of the inventive concept, the plurality of serializer circuits $102_1$, $102_2$, ... $102_N$ may receive 18-bit parallel input. In an exemplary embodiment of the inventive concept, the plurality of serializer circuits $102_1$, $102_2$, ... $102_N$ may receive 14-bit parallel input. As used herein the term "bits" is used interchangeably with the term "data". Hence, a person of ordinary skill in the art should understand that when the term "data" is used in the present application, it refers to "bit" unless any other specific meaning is defined therein.

The clock signal generator 103 may generate a high-speed clock signal (e.g., a first clock signal) having a plurality of phases. In an exemplary embodiment of the inventive concept, the high-speed clock signal may be a full-rate clock signal. For example, if a data rate is 1 Gbps, the clock signal is 1 GHz. In an exemplary embodiment of the inventive concept, the high-speed clock signal may be a half-rate clock signal. For example, if the data rate is 1 Gbps, the clock signal is 0.5 GHz. In an exemplary embodiment of the inventive concept, the high-speed clock signal may be a quarter-rate clock signal. For example, if the data rate is 1 Gbps, the clock signal is 0.25 GHz. A person skilled in the art will appreciate that the high-speed clock signal can be any fraction of the data rate based on an architecture. Each lane may have a corresponding parallel clock generator to generate a parallel clock (divided clock) signal using the high-speed clock signal from the clock signal generator 103. The respective parallel clock signals may be used to drive data (bits) on each lane.

In an exemplary embodiment of the inventive concept, the clock signal generator 103 may be a Phase Locked Loop (PLL). The PLL is a feedback system that generates an output signal having a phase related to a phase of an input reference signal. Generally, the PLL is designed to reduce error between an input phase and an output phase to zero. The PLL is used in the multi-lane transmitting apparatus 100 to lock (match) the parallel clock signals of the plurality of lanes $101_1, 101_2, \ldots 101_N$ with the high-speed clock signal, to synchronize the plurality of lanes $101_1, 101_2, \ldots 101_N$. In an exemplary embodiment of the inventive concept, a plurality of deserializer circuits (e.g., $104_1, 104_2, \ldots 104_N$) may be configured between two lanes each among the plurality of lanes $101_1, 101_2, \ldots 101_N$. In an exemplary embodiment of the inventive concept, a deserializer circuit $104_{12}$ is configured between lane 1 $101_1$ and lane 2 $101_2$, a deserializer circuit $104_{34}$ is configured between lane 3 $101_3$ and lane 4 $101_4$, a deserializer circuit $104_{(N-1 N)}$ is configured between lane n-1 $101_{N-1}$ and lane n $101_N$.

FIG. 1 illustrates only deserializer circuits $104_1$ and $104_N$ for describing the inventive concept. For example, FIG. 1 shows the deserializer circuit $104_1$ configured between the lanes $101_1$ and $101_2$. The deserializer circuit $104_1$ may receive inputs from any one of the two lanes $101_1$ and $101_2$ at a time to convert respective serial bits to the parallel bits. In an exemplary embodiment of the inventive concept, the plurality of deserializer circuits $104_1, 104_2, \ldots 104_N$ may receive the inputs from even-numbered lanes or odd numbered lanes, when the plurality of deserializer circuits $104_1, 104_2, \ldots 104_N$ are connected to two even numbered lanes or two odd numbered lanes. In an exemplary embodiment of the inventive concept, the plurality of deserializer circuits $104_1, 104_2, \ldots 104_N$ may receive the inputs in one or more combinations (e.g., sequentially as shown in FIG. 1 or between any two lanes such as lane 1 and lane 4, lane 2 and lane 3, lane 5 and lane 8, and so on). The inventive concept is not limited to how the deserializer is connected between two lanes and the inventive concept envisages different combinations in which the deserializer may be connected between two lanes. In an exemplary embodiment of the inventive concept, multiple lanes may be connected to the deserializer using a N:1 multiplexer.

In an exemplary embodiment of the inventive concept, the BIST unit 105 may test the multi-lane transmitting apparatus 100. The BIST unit 105 may generate a signal (a defined pattern of parallel bits), and provide the signal and a corresponding phase of the high-speed clock signal to the plurality of lanes $101_1, 101_2, \ldots 101_N$. The BIST unit 105 may compare an output signal from the plurality of lanes $101_1, 101_2, \ldots 101_N$ with the defined pattern of parallel bits to determine a correct working of each lane from the plurality of lanes $101_1$ and $101_2$. A lane is determined to work correctly when the output of the lane (after de-serialization) matches the defined pattern. The BIST unit 105 may iterate the BIST testing over other phases of the high-speed clock signal for the plurality of lanes $101_1$ and $101_2$, and identify a phase of the high-speed clock signal where a maximum number of lanes work correctly and identify one or more lanes which do not work correctly for the identified phase of the high-speed clock signal. The identified one or more lanes are then phase calibrated, thus synchronizing the lanes $101_1$ and $101_2$ to the identified phase of the high-speed clock signal.

Figure 2:
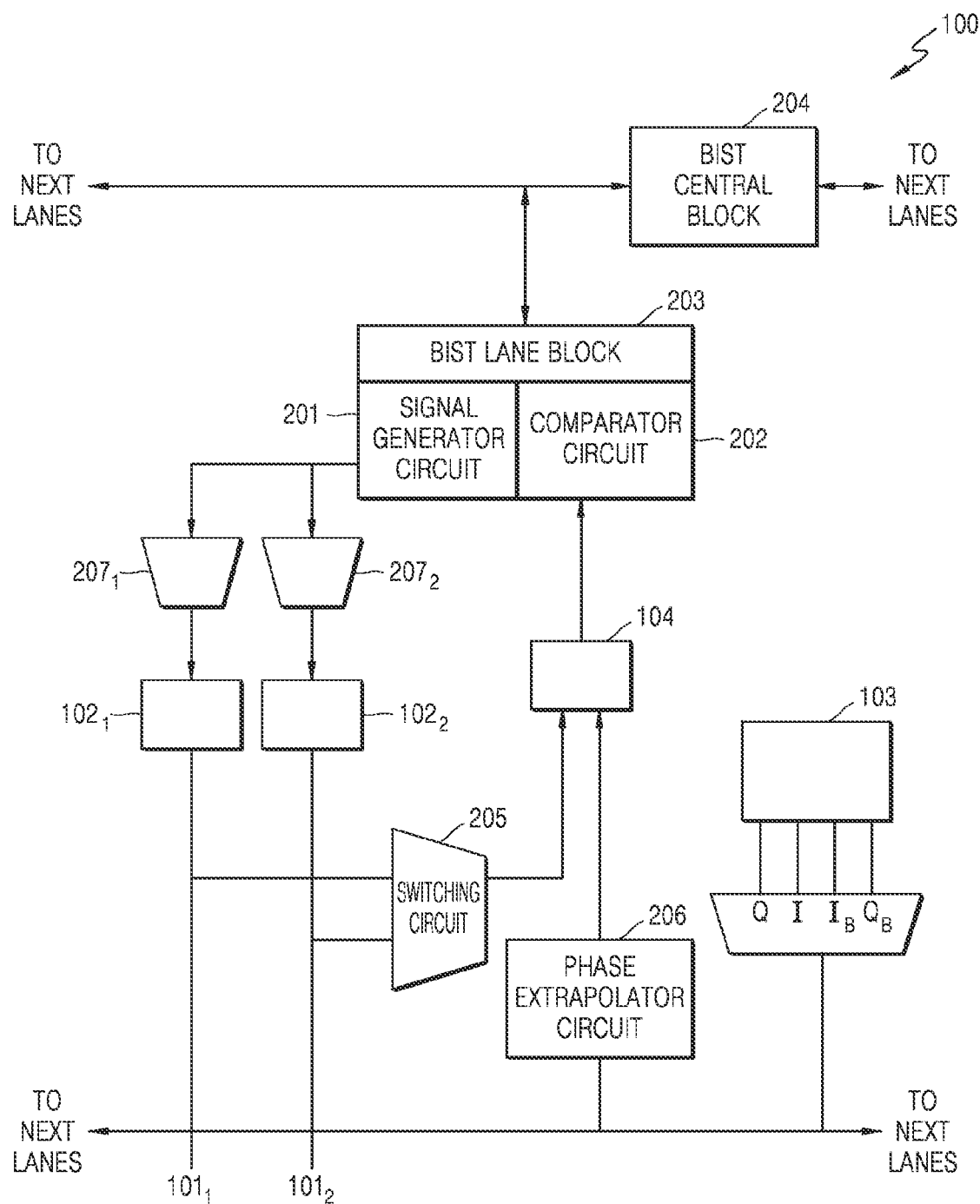
FIG. 2 shows a detailed block diagram of the multi-lane transmitting apparatus of FIG. 1, in accordance with an exemplary embodiment of the inventive concept.

FIG. 2 shows a detailed block diagram of the multi-lane transmitting apparatus of FIG. 1, in accordance with an exemplary embodiment of the inventive concept. FIG. 2 is illustrated considering two lanes $101_1$ and $101_2$. The illustration of FIG. 2 is applicable to other lanes among the plurality of lanes $101_1, \ldots, 101_N$. The multi-lane transmitting apparatus 100 includes the lanes $101_1$ and $101_2$, the respective serializer circuits $102_1$ and $102_2$, a switching circuit 205, a deserializer circuit 104 (e.g., $104_1$, the clock signal generator 103, a plurality of multiplexer circuits $207_1$ and $207_2$, a signal generator circuit 201, a comparator circuit 202, a BIST lane block 203, a BIST central block 204, and a phase extrapolator circuit 206. According to an exemplary embodiment of the inventive concept, the BIST lane block 203 and the BIST central block 204 may be circuits.

The signal generator circuit 201, the comparator circuit 202, the BIST lane block 203, the BIST central block 204, and the phase extrapolator circuit 206 together form the BIST unit 105. The switching circuit 205 is configured to connect each of the two lanes to the respective deserializer circuit 104. Each lane of the plurality of lanes $101_1, 101_2, \ldots, 101_N$ is connected to a respective deserializer circuit via a respective switching circuit (e.g., $205_1$) (e.g., switching circuit $205_1$ connects each of the lanes $101_1$ and $101_2$ to the deserializer circuit $104_1$). A plurality of switching circuits $205_1, \ldots, 205_N$ may connect each lane to the respective deserializer circuit. The switching circuit 205 may be a multiplexer (e.g., 2:1 mux) connecting each of the two lanes to the respective deserializer circuits.

The signal generator circuit 201 is configured between the two lanes $101_1$ and $101_2$. A plurality of signal generator circuits (e.g., $201_1, 201_2, 201_N$) may be configured between the plurality of lanes $101_1, 101_2, \ldots, 101_N$. The signal generator circuit 201 generates a signal having parallel bits in a defined pattern. For example, the signal may be 10101010. The signal corresponding to each of the plurality of phases of the high-speed clock signal may be provided to the two lanes $101_1$ and $101_2$. The signal may be provided to each of the two lanes using respective multiplexers $207_1$ and $207_2$. The plurality of phases of the high-speed clock signal may range from 0° to 360°. For example, the plurality of phases may be 90°, 180°, 270°, and 360° (Q, I, $Q_B$, and $I_B$ in FIG. 2).

The comparator circuit 202 is configured between the two lanes $101_1$ and $101_2$. A plurality of comparator circuits $202_1, 202_2, 202_N$ may be configured between the plurality of lanes $101_1, 101_2, 101_N$. The comparator circuit 202 compares a pattern of bits of an output signal from each of the two lanes $101_1$ and $101_2$. The comparator circuit 202 may determine if there is a match between the output signal from each of the two lanes and the defined pattern of bits. An output of the comparator circuit 202 may indicate a matched status or an unmatched status of the pattern of bits of the output signal. For example, the output of the comparator circuit 202 may be 1 or 0. The output of 1 may indicate the matched status and the output of 0 may indicate the unmatched status. In another example, the output of 1 may indicate the unmatched status and the output of 0 may indicate the matched status.

The BIST lane block 203 is configured between two lanes $101_1$ and $101_2$. A plurality of BIST lane blocks (e.g., $203_1$, $203_2$, $203_N$) may be configured between the plurality of lanes $101_1$, $101_2$, ..., $101_N$. The BIST lane block 203 may monitor a status of each of the two lanes $101_1$ and $101_2$ based on the output of the corresponding comparator circuit (e.g., 202). For example, a first BIST lane block $203_1$ may monitor the status of two lanes $101_1$ and $101_2$, and may receive the status of the two lanes $101_1$ and $101_2$ as 1 (matched status) and 0 (unmatched status), respectively. In another example, the BIST lane block $203_2$ may receive the status of both the lanes $101_3$ and $101_4$ as 0 (unmatched status). Further, the BIST lane block 203 may store the status of each of the two lanes.

The BIST central block 204 is configured to receive the status of the plurality of lanes $101_1$, $101_2$, ..., $101_N$ from the plurality of BIST lane blocks (e.g., $203_1$, $203_2$, ..., $203_N$). The BIST central block 204 may determine one or more lanes from the plurality of lanes $101_1$, $101_2$, $101_N$ having the unmatched status, and a corresponding phase among the plurality of phases of the high-speed clock signal may also be determined. For example, there may be 10 lanes. Lane 7, lane 8, lane 9, and lane 10 may have the unmatched status. Lanes 1-6 may have matched status. In an exemplary embodiment of the inventive concept, the one or more lanes may have the unmatched status due to phase mismatch between the clock signal delivered to the one or more lanes and the high-speed clock signal. The BIST central block 204 may determine if a number of the one or more lanes is less than a threshold value. For example, the threshold value may be 0.5 (50%) on a scale of 0-1. In the example above, the total number of lanes is 10. The BIST central block 204 may determine if the number of lanes with the unmatched status is less than 5. Lane 7, lane 8, lane 9, and lane 10 may have the unmatched status, e.g., four lanes have the unmatched status. Hence, the number of lanes (4) is less than the threshold value (5). In an exemplary embodiment of the inventive concept, the BIST central block 204 may determine a phase among the plurality of phases of the high-speed clock signal for which a maximum number of lanes have the matched status.

The phase extrapolator circuit 206 is configured between two lanes of the plurality of lanes $101_1$, $101_2$, ..., $101_N$. A plurality of phase extrapolator circuits (e.g., $206_1$, $206_2$ ..., $206_N$) may be configured between the plurality of lanes $101_1$, $101_2$, ..., $101_N$. The phase extrapolator circuit 206 adjusts the phase of the high-speed clock signal provided to the one or more lanes when the number of the one or more lanes is less than the threshold value. The phase of the high-speed clock signal provided to the one or more lanes is adjusted according to a delay calibrated in the one or more lanes. This is termed as delay calibration according to exemplary embodiments of the inventive concept. Phase calibration refers to selecting the phase for which a maximum number of lanes among the plurality of lanes $101_1$, $101_2$ ..., $101_N$ pass the BIST.

For example, the phase of the high-speed clock signal provided to the lanes 7-10 is adjusted according to the delay calibrated in the lanes 7-10. The phase of the high-speed clock signal of a lane (e.g., lane 7 $101_7$) can be aligned with the clock signal of the other lanes. Thus, the bits in each lane are aligned with each other. In an exemplary embodiment of the inventive concept, the phase difference or delay in the clock signals of the one or more lanes may be caused due to a clock path. The clock path of the multi-lane transmitting apparatus 100 may have a delay chain. The delay chain may include one or more delay circuits. The one or more delay circuits may be one or more buffers. The delay circuits may cause a delay in the clock signals. For example, one delay circuit may cause a delay of 20 ps. When there are 5 delay circuits in the delay chain, then, the minimum delay is 5*20 ps=100 ps. Each lane may have different number of delay circuits. Hence, each lane may have different delay in the clock signal from the selected phase (e.g., first phase).

For example, a first lane may have 30 ps delay. A second lane may have 10 ps delay. The delay is adjusted until the phases of the one or more lanes synchronize with the high-speed clock signal. There may be one or more multiplexers in the clock path to multiplex the selected delay with the parallel bits in the one or more lanes. A first delay (minimum delay) (e.g., 20*ps*) in the delay chain may be selected and the phase of the one or more lanes with the unmatched status may be adjusted. For example, the selected phase is 0°. The extrapolated phase may be 0°+20 ps. The extrapolated phase may be provided to the one or more lanes. With the extrapolated phase, a few of the one or more lanes may have the matched status. For example, lane 1 and lane 2 among the lanes 1-3 may have the matched status. The status of the one or more lanes is received from the respective BIST lane block 203 after the delay calibration is completed.

Figure 3:
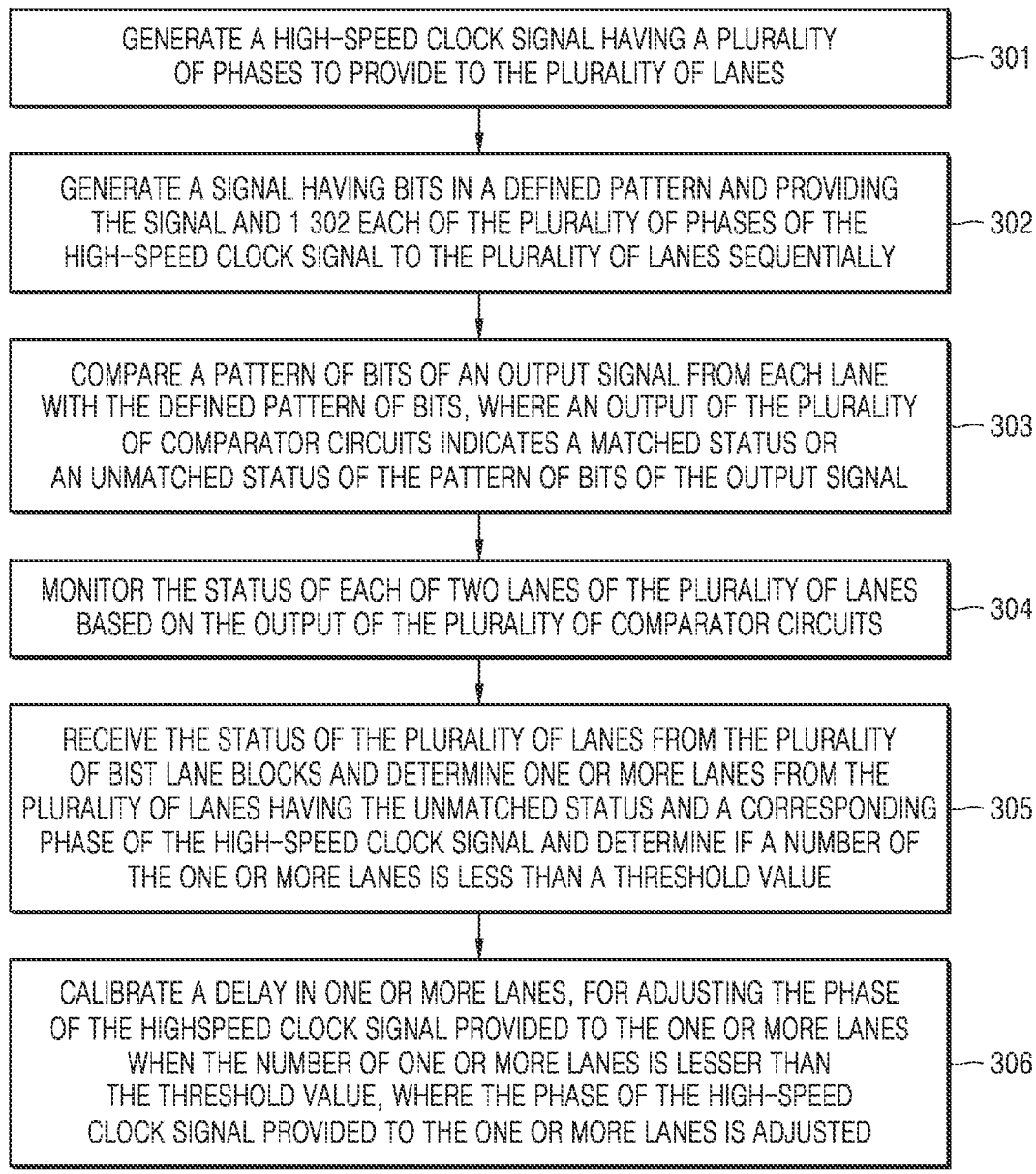
FIG. 3 shows a flowchart illustrating a method for testing the multi-lane transmitting apparatus of FIG. 1, in accordance with an exemplary embodiment of the inventive concept.
Figure 4:
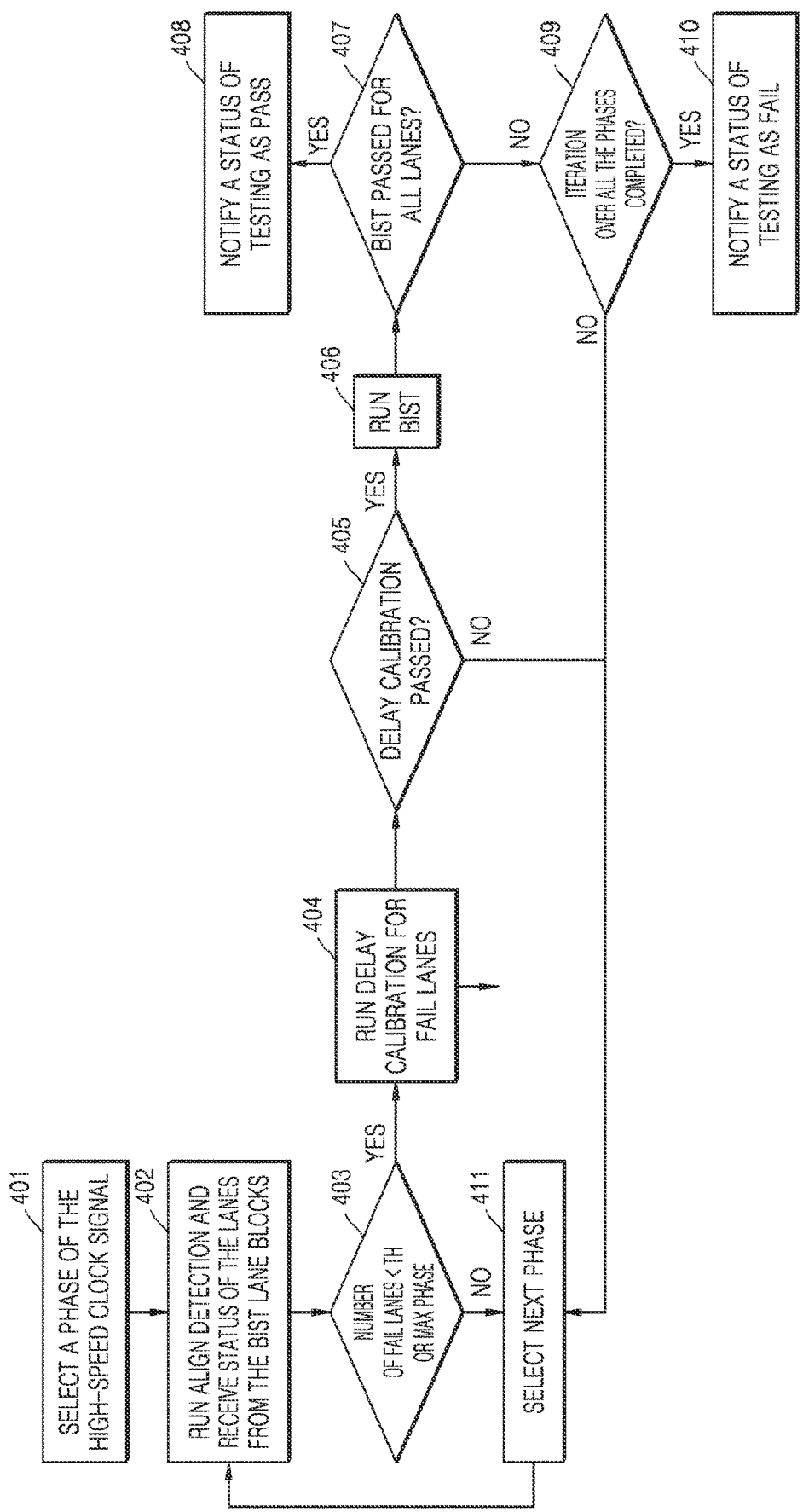
FIG. 4 shows a detailed flowchart for testing the multi-lane transmitting apparatus of FIG. 1, in accordance with an exemplary embodiment of the inventive concept.
Figure 5:
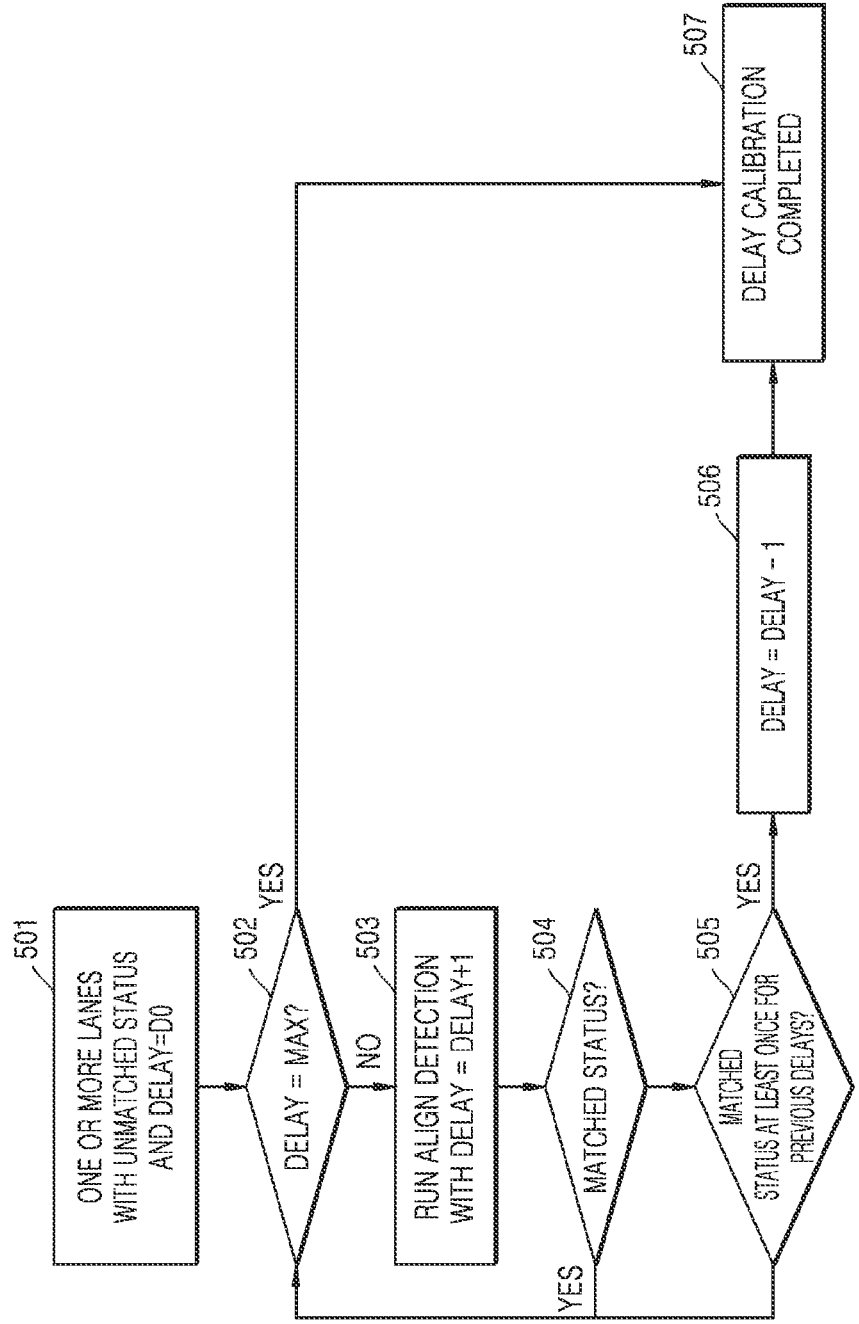
FIG. 5 shows a flowchart for delay calibration in the multi-lane transmitting apparatus of FIG. 1, in accordance with an exemplary embodiment of the inventive concept.
Figure 6:
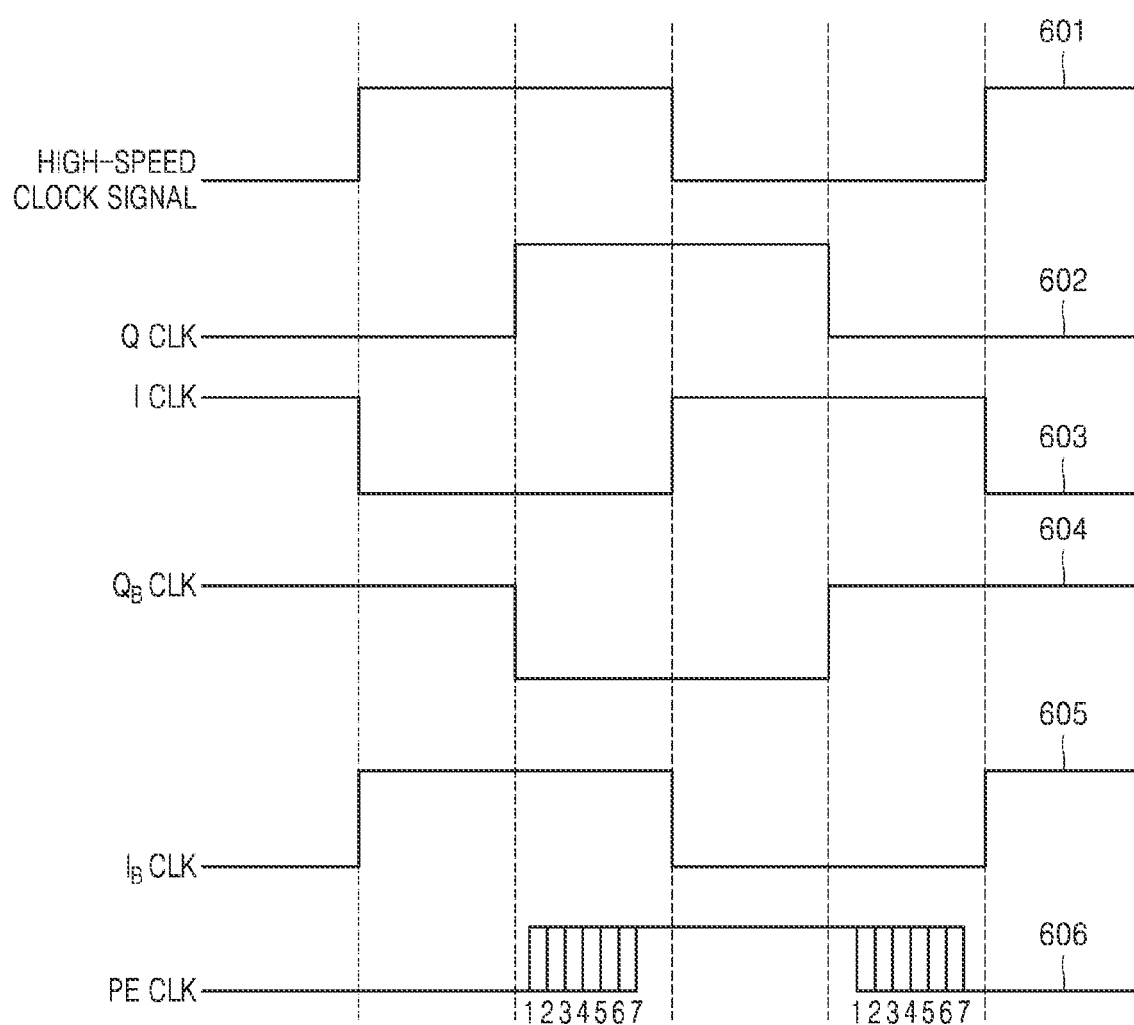
FIG. 6 illustrates waveforms generated in the multi-lane transmitting apparatus of FIG. 1 while testing the multi-lane transmitting apparatus, in accordance with an exemplary embodiment of the inventive concept.

FIG. 3 shows a flowchart illustrating a method for testing the multi-lane transmitting apparatus of FIG. 1, in accordance with an exemplary embodiment of the inventive concept. FIG. 4 shows a detailed flowchart for testing the multi-lane transmitting apparatus of FIG. 1, in accordance with an exemplary embodiment of the inventive concept. FIG. 5 shows a flowchart for delay calibration in the multi-lane transmitting apparatus of FIG. 1, in accordance with an exemplary embodiment of the inventive concept. FIG. 6 illustrates waveforms generated in the multi-lane transmitting apparatus of FIG. 1 while testing the multi-lane transmitting apparatus, in accordance with an exemplary embodiment of the inventive concept.

As illustrated in FIG. 3, a method 300 may include one or more operations. The method 300 may be described in the general context of computer executable instructions. Generally, computer executable instructions can include routines, programs, objects, components, data structures, procedures, modules, or functions, which perform particular functions or implement particular abstract data types.

The order in which the method 300 is described is not intended to be construed as a limitation, and any number of the described method blocks can be combined in any order to implement the method. Additionally, individual blocks may be deleted from the method without departing from the scope of the subject matter described herein. Furthermore, the method can be implemented in any suitable hardware, software, firmware, or combination thereof. FIG. 3 is described with reference to FIG. 4, FIG. 5, and FIG. 6.

At operation 301, the clock signal generator 103 generates the high-speed clock signal having the plurality of phases. The high-speed clock signal of each of the plurality of phases is provided to the plurality of lanes $101_1$, $101_2$, ..., $101_N$. The high-speed clock signal may be any fraction of the data rate based on the architecture. Each lane may have a corresponding parallel clock generator to generate a parallel clock (divided clock) signal using the high-speed clock signal from the clock signal generator 103. The parallel clock signals may be used to drive the bits on respective lanes. In an exemplary embodiment of the inventive concept, the clock signal generator 103 may be a Phase Locked Loop (PLL). The high-speed clock signal of each of the plurality of phases is provided to the plurality of lanes $101_1$, $101_2$, . . . , $101_N$, as described above.

Referring to FIG. 6, a waveform 601 shows the high-speed clock signal generated by the clock signal generator 103. A waveform 602 shows a Q clock which corresponds to a 90° phase of the high-speed clock signal. A waveform 603 shows an I clock which corresponds to a 180° phase of the high-speed clock signal. A waveform 604 shows a Qb clock which corresponds to a 270° phase of the high-speed clock signal. A waveform 605 shows an Ib clock which corresponds to a 0° phase of the high-speed clock signal. In an exemplary embodiment of the inventive concept, the high-speed clock signal may be generated with different phases (between) 0-360° and are not limited to the example phases mentioned above. Reference is now made to FIG. 4. The term 'Th' in the FIG. 4 is used to indicate the threshold value. At operation 401, a first phase of the high-speed clock signal is selected, and the first phase is provided to the plurality of lanes $101_1$, $101_2$, . . . , $101_N$. For example, the first phase may be 0°.

Referring back to FIG. 3, at operation 302, the plurality of signal generator circuits (e.g., $201_1$, $201_2$, . . . , $201_N$) generate a signal having bits in a defined pattern (parallel bits), and provide the signal and each of the plurality of phases of the high-speed clock signal to the plurality of lanes $101_1$, $101_2$, . . . , $101_N$. The signal may be provided to the plurality of lanes $101_1$, $101_2$, . . . , $101_N$ sequentially. The plurality of lanes $101_1$, $101_2$, . . . , $101_N$ are configured to serialize the parallel data according to the input clock signal. However, the clock signal input to the lanes may not be pure and may have phase delays due to various reasons including distance between the plurality of lanes $101_1$, $101_2$, . . . , $101_N$ and the clock signal generator 103. In an exemplary embodiment of the inventive concept, a signal having bits in a defined pattern is generated by the signal generator circuit 201. For example, the signal may be 10101010. A first signal and a second signal may be generated and provided to each lane. The first signal may have a known pattern of bits and may be a simple pattern of bits (e.g., 10101010). The BIST testing may be performed using the first signal. When a result of the BIST testing is pass, the second signal having a complex pattern (e.g., 1101000101001010) of bits may be provided to the plurality of lanes $101_1$, $101_2$, . . . , $101_N$ to re-test the multi-lane transmitting apparatus 100 for complex patterns.

At operation 303, the plurality of comparator circuits $202_1$, $202_2$, . . . , $202_N$ compare the pattern of bits of the output signal from each lane of the plurality of lanes $101_1$, $101_2$, . . . , $101_N$ with the defined pattern of bits, for each of the plurality of phases of the high-speed clock signal, where the output of each comparator circuit 202 indicates the matched status or the unmatched status of the pattern of bits of the output signal. In an exemplary embodiment of the inventive concept, the output of a lane matches with the defined pattern when the phase of the clock signal provided to that lane is matched with the phase of the high-speed clock signal. When there is a phase difference between the clock signal input to the lane and the high-speed clock signal, the output pattern of the lane does not match with the defined pattern. The pattern of bits of the output signal from the plurality of lanes $101_1$, $101_2$, . . . , $101_N$ is compared with the defined pattern of bits. For example, the pre-defined output signal may be 11110000. The output from the plurality of lanes $101_1$, $101_2$, . . . , $101_N$ may be 11110001. The comparator circuit 202 may determine if there is a match between the output signal from each of the two lanes and the defined output signal. The output of the comparator circuit 202 may indicate the matched status or the unmatched status of the pattern of bits of the output signal. In the above example, there is a mismatch between the output signal from a lane and the pre-defined output signal. The output of the comparator circuit 202 may be 1 or 0 as described above.

At operation 304, the plurality of BIST lane blocks $203_1$, $203_2$, . . . , $203_N$ monitor the status of each of two lanes of the plurality of lanes $101_1$, $101_2$, . . . , $101_N$ based on the output of the plurality of comparator circuits $202_1$, $202_2$, . . . , $202_N$, where each BIST lane block 203 is configured between two lanes of the plurality of lanes $101_1$, $101_2$, . . . , $101_N$. The status of each of the two lanes of the plurality of lanes $101_1$, $101_2$, . . . , $101_N$ may be monitored by the BIST lane block 203 based on the output of the corresponding comparator circuit. For example, the BIST lane block 203 may monitor the status of two lanes $101_1$ and $101_2$. The BIST lane block 203 may receive the status of the two lanes $101_1$ and $101_2$ as 1 (matched status) or 0 (unmatched status). Further, the BIST lane block 203 may configure the signal generator circuit 201 of each lane of the one or more lanes having the unmatched status to generate the signal in incremental phases for the one or more lanes.

At operation 305, the BIST central block 204 receives the status of the plurality of lanes $101_1$, $101_2$, . . . , $101_N$ from the plurality of BIST lane blocks (e.g., $203_1$, $203_2$, $203_N$), and determines one or more lanes from the plurality of lanes $101_1$, $101_2$, . . . , $101_N$ having the unmatched status and a corresponding phase among the plurality of phases of the high-speed clock signal when a number of the one or more lanes is less than the threshold value. The BIST central block 204 may determine one or more lanes from the plurality of lanes $101_1$, $101_2$, . . . , $101_N$ having the unmatched status. A corresponding phase among the plurality of phases of the high-speed clock signal may be noted or determined. The BIST central block 204 may determine if a number of the one or more lanes is less than the threshold value. If the number of the one or more lanes is greater than or equal to the threshold value, a testing result may indicate failure.

Referring back to FIG. 4, at operation 402, the BIST central block 204 may run align detection and receive the status of the plurality of lanes $101_1$, $101_2$, . . . , $101_N$ from the plurality of BIST lane blocks $203_1$, $203_2$, . . . , $203_N$. In the present specification, the align detection refers to comparing the pattern of bits of the output signal from the lane with the known pattern of bits and determining if the lane has the matched status or the unmatched status.

At operation 403, the BIST central block 204 may determine if the number of the one or more lanes having the unmatched status is less than the threshold value. In the present specification, a lane having an unmatched status is referred as a fail lane. A counter may be used to increment a count value of the number of the one or more lanes having the unmatched status, when the status is received from one or more BIST lane blocks corresponding to the one or more lanes. The count value may indicate the number of the one or more lanes having the unmatched status.

When the number of the one or more lanes with the unmatched status is less than the threshold value, at operation 404, one or more phase extrapolator circuits $206_1$, $206_2$, . . . , $206_N$ corresponding to the one or more lanes performs the delay calibration for the one or more lanes (fail lanes). The delay calibration is explained in detail below with reference to FIG. 5.

At operation 405, when the one or more lanes have passed the delay calibration, e.g., the one or more lanes have passed the align detection, the BIST central block 204 may run the BIST and receive the status of the plurality of lanes $101_1$, $101_2$, $101_N$ from the plurality of BIST lane blocks $203_1$, $203_2$, $203_N$ at operation 406. In the present specification, running the BIST refers to comparing the pattern of bits of the output signal from the lane with a complex pattern of bits and determining if the lane has the matched status or the unmatched status.

At operation 405, when the delay calibration is not passed for the selected phase, the next phase of the high-speed clock signal is selected at operation 411. At operation 407, the BIST central block 204 determines if all the one or more lanes have the matched status. At operation 408, when all the one or more lanes have the matched status, the BIST central block 204 notifies the status of testing as pass. At operation 409, when not all the one or more lanes have the matched status, the BIST central block 204 determines if iteration is completed for each of the plurality of phases. The iteration refers to repeating the receiving of status of the lanes and determining the matched status for all the selected phases of the high-speed clock signal. If the iteration is not completed for each of the plurality of phases, the next phase of the high-speed clock signal is selected at operation 411 and operations 401 to 409 are repeated for the remaining phases. For example, the selected phases may be 90°, 180°, 270°, and 360°. If the iteration is completed, at operation 410, the BIST unit 105 notifies the status of testing as fail.

At operation 403, when the number of the one or more lanes with the unmatched status is greater than the threshold value and when the selected phase is not a maximum phase, the next phase of the high-speed clock signal is selected at operation 411. In the present specification, the maximum phase refers to a last phase when iteration is performed for the remaining phases. The operations 401 to 409 are repeated for the remaining phases. At operation 410, the BIST central block 204 may notify the status of the testing as fail when not all the one or more lanes have the matched status, since the iteration is performed over all the selected phases of the high-speed clock signal. In an exemplary embodiment of the inventive concept, the BIST unit 105 includes a port associated with a notification unit for notifying a status of testing of the plurality of lanes $101_1$, $101_2$, ..., $101_N$ via the notification unit. For example, a Light Emission Diode (LED) notification may be provided to indicate a pass or fail status. A green light may indicate a passing of the BIST, and a red light may indicate a failing of the BIST.

Referring back to FIG. 3, at operation 306, the respective phase extrapolator circuits among the plurality of phase extrapolator circuits $206_1$, $206_2$, ..., $206_N$ calibrate the delay in one or more lanes. The delay in the one or more lanes are calibrated for adjusting the phase of the high-speed clock signal provided to the one or more lanes when the number of one or more lanes is less than the threshold value (when maximum lanes have passed and the one or more lanes have failed). The phase extrapolator circuit 206 adjusts the phase of the high-speed clock signal provided to the one or more lanes when the number of the one or more lanes with the unmatched status is less than the threshold value. The phase of the high-speed clock signal provided to the one or more lanes is adjusted according to a delay calibrated in the one or more lanes.

In an exemplary embodiment of the inventive concept, two calibrations are performed in the multi-lane transmitting apparatus 100. A first calibration includes the phase calibration and a second calibration includes the delay calibration. The phase calibration is performed when the number of the one or more lanes with the unmatched status is less than the threshold value for the input phase (e.g., first phase). For example, when the first phase of the high-speed clock signal is provided to the plurality of lanes $101_1$, $101_2$, ..., $101_N$, and a maximum number of lanes have the matched status, the first phase is selected to operate the plurality of lanes $101_1$, $101_2$, ..., $101_N$. In other words, the first phase is selected to operate the plurality of lanes $101_1$, $101_2$, ..., $101_N$. To operate the plurality of lanes $101_1$, $101_2$, ..., $101_N$ in the selected phase (e.g., first phase), the delay calibration is performed on the one or more lanes among the plurality of lanes $101_1$, $101_2$, $101_N$, which have the unmatched status.

In an exemplary embodiment of the inventive concept, the delay may have occurred due to the distance between the one or more lanes and the clock signal generator 103. In an exemplary embodiment of the inventive concept, the delay calibration includes selecting a clock delay value for adjusting the phase of the one or more lanes with the selected phase (e.g., first phase). The phase of the one or more lanes are compared with the selected phase, and a difference between the phase of the one or more lanes and the selected phase is the clock delay or phase delay. Since the first phase is selected to operate the plurality of lanes $101_1$, $101_2$, ..., $101_N$, the clock signal of the one or more lanes are calibrated to match the first phase.

In an exemplary embodiment of the inventive concept, a first delay value (minimum delay) (e.g., 20 ps) in the delay chain may be selected and the phase of the one or more lanes may be adjusted. With the extrapolated phase, a few of the one or more lanes may have the matched status after delay calibration with the first delay value. Further, the status of the one or more lanes is received from the respective BIST lane block 203 after performing the delay calibration with the first delay value. Further, a second delay value (e.g., 40 ps) in the delay chain may be selected and the phase of the one or more lanes with unmatched status may be adjusted. For example, the delays in the delay chain may be 20 ps, 40 ps, 60 ps, 80 ps, and 100 ps. The delays are incrementally provided to each lane of the one or more lanes. For example, phases of lane 9 and lane 10 may be adjusted with the delay 40 ps. Lane 9 may have the matched status after the delay calibration. Lane 10 may have the unmatched status. The phase of lane 10 may be adjusted by providing a further delay of 20 ps, therefore providing an effective delay of 60 ps. In an exemplary embodiment of the inventive concept, the delay provided is incremented until the maximum delay value (for example, 100 ps) is provided or the phase of the lane is matched with the selected phase.

Reference is now made to FIG. 5 that shows the delay calibration for the one or more lanes with the unmatched status (fail lanes) in the multi-lane transmitting apparatus 100. The delay calibration is performed when the one or more lanes have the unmatched status for the align detection. A single lane is considered for explaining operations 501 to 506. However, operations 501 to 506 can be performed for all the fail lanes.

At operation 501, the BIST central block 204 may provide a signal to the phase extrapolator circuit 206 corresponding to a lane with the unmatched status for performing the delay calibration. At operation 502, a current delay value (e.g., D0=0) is compared with a maximum value to check if the delay value has reached the maximum value. In an exemplary embodiment of the inventive concept, the minimum delay in the delay chain may be 20 ps and the maximum delay in the delay chain may be 100 ps. In an example, the delay value (D0) may be 100 ps at a first instance. At operation 502, the phase extrapolator circuit 206 determines if the delay selected has reached the maximum value (e.g., 100 ps). When the delay value has not reached the maximum value, the delay value is incremented at operation 503 to begin the delay calibration and the align detection is performed with the incremented delay. In an example, the minimum delay (e.g., 20 ps) in the delay chain is provided. In another example, when the delay is 40 ps in the first instance, the delay value 60 ps is provided (40 ps+20 ps).

At operation 504, considering the initial delay value D0=0, the BIST is performed for the incremented delay value (e.g., 20 ps) and the status is received from the respective BIST lane block. If the lane has the matched status for the incremented delay (e.g., 20 ps), then the phase extrapolator circuit 206 determines if the delay provided has reached the maximum value. When the delay value (e.g., 20 ps) has not reached the maximum value (e.g., 100 ps), the delay is incremented at operation 503 to the next value in the delay chain (e.g., 40 ps). The align detection is performed for the incremented delay value (e.g., 40 ps) and the status is received from the respective BIST lane block for the lane. In an exemplary embodiment of the inventive concept, the delay value is incremented until it reaches the maximum value, or the status is not matched.

At operation 504, the current status of the lane is compared with the matched status. When the status is not matched for a delay value, at operation 505, it is determined if the matched status is obtained at least once for previous delays provided to the lane. If the matched status is obtained at least once for the previous delays, at operation 506, the delay value is decremented by step size (a minimum delay value) and at operation 507, the calibration is completed.

In an example, the delay value at the first instance is 20 ps. The lane may have unmatched status for the incremented delay value 40 ps. Since the lane has the unmatched status for both 20 ps and 40 ps, it is determined that the matched status is not obtained for previous delay, e.g., 20 ps. Operations 502 to 507 are repeated for subsequent delays in delay chain to determine the status of the lane for all the delays in the delay chain. In an exemplary embodiment of the inventive concept, when the BIST passes for all delay values and when the delay value reaches the maximum value, the calibration is completed. For example, the step size may be 20 ps and the initial delay may be zero. The delay is incremented in 20 ps for each iteration and the BIST is executed for each iteration. In this example, the BIST may pass for the effective delay values of 20 ps, 40 ps, 60 ps, 80 ps, and 100 ps. When the effective delay value reaches 100 ps, the calibration is completed as the effective delay has reached the maximum value. In another example, the BIST may pass for 20 ps, 40 ps, and 60 ps, and may fail for 80 ps. So, the delay value is decremented by the step size and the calibration is completed. Hence, the window for which the BIST passes is 20 ps-60 ps. After calibrating with each delay value, the status of the one or more lanes is determined to identify if the one or more lanes have a phase match with the selected phase (e.g., first phase). Referring again to FIG. 6, a waveform 606 shows the extrapolated phase over the delays where the minimum delay is 1 (e.g., 10 ps) and the maximum delay is 7 (e.g., 70 ps).

Figure 7:
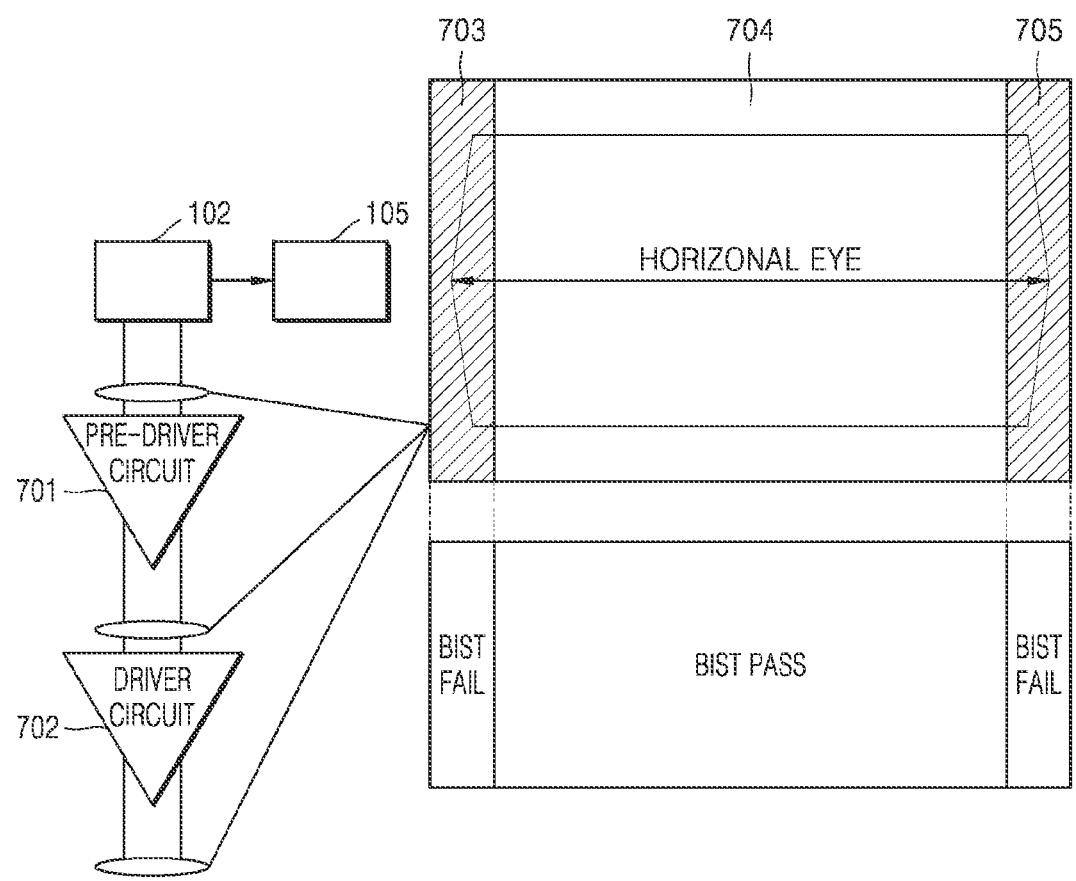
FIG. 7 illustrates extension of BIST testing to a driver circuit of the multi-lane transmitting apparatus of FIG. 1, in accordance with an exemplary embodiment of the inventive concept.

FIG. 7 illustrates extension of BIST testing to a driver circuit of the multi-lane transmitting apparatus of FIG. 1, in accordance with an exemplary embodiment of the inventive concept. In an exemplary embodiment of the inventive concept, the multi-lane transmitting apparatus 100 may further include a pre-driver circuit 701 and a driver circuit 702. Typically, in the multi-lane transmitting apparatus 100, when an oscilloscope is used to measure an output of the driver circuit 702, an eye diagram is created on a display of the oscilloscope by superimposing successive waveforms to form a composite image. The eye diagram is used for the purpose of recognizing the effects of jitter and a source of the jitter. The eye diagram is used to monitor the performance of a circuit. For the multi-lane transmitting apparatus 100, an eye opening created by the driver circuit 702 is mainly monitored, since the driver circuit 702 is exposed as a pin of an Integrated Circuit (IC) and the driver circuit 702 drives the receiver.

For example, consider a data rate of 10 Gbps and 100 ps as the duration of a clock signal, for transmitting data. A plurality of clock signals of 100 ps are superimposed, to generate the eye diagram. It is observed that for the same 100 ps, a rising edge or falling edge of the clock signal moves from an ideal value. There may be many sources of the jitter which moves the edges of the clock signal from the ideal value. An area 703 indicates an area of the jitter. Since the jitter is caused on both the rising edge and the falling edges, the jitter appears at both the sides of the eye diagram, e.g., the area 703 and an area 705. An area 704 represents no jitter area, where there are no transitions of the clock signal. Hence, there is no jitter. Consider the eye width is 100 ps and the widths of the area 703 and 705 are 10 ps each. Then, the width of the area 704 indicates the width of the eye opening, which is 80 ps (100 ps-10 ps-10 ps). In an exemplary embodiment of the inventive concept, each of the plurality of phases of the high-speed clock signal is provided to the driver circuit 702 in the multi-lane transmitting apparatus 100. An output of the driver circuit 702 is measured for each of the plurality of phases. The output of BIST testing is BIST FAIL in the areas 703 and 705. The output of BIST testing is BIST PASS in the area 704. When the BIST testing is performed over granular phases of the clock signal, the width of the eye opening may be obtained. For example, the BIST testing is performed over a granular size of 1 ps over the 100 ps. A count of the status of the BIST testing obtained is 20, which may indicate that the jitter is over 20 ps and the width of the eye opening is 80 ps. The width of the eye opening is used to monitor the performance of the driver circuit.

The inventive concept performs the BIST in the multi-lane transmitting apparatus 100. Thus, an additional test receiver is not required, which reduces the cost of the testing. A single deserializer circuit 104, a signal generator circuit 201, and a comparator circuit 202 are used between two lanes, thus reducing cost and size of the multi-lane transmitting apparatus 100. Exemplary embodiments of the inventive concept notify a status of the testing over a single pin via the notification unit. Exemplary embodiments of the inventive concept also extend the BIST to the driver circuit for measuring the width of the eye opening of the multi-lane transmitting apparatus 100, thus monitoring performance of the multi-lane transmitting apparatus 100.

A description of an exemplary embodiment with several components in communication with one another does not imply that all such components are required. On the contrary, a variety of optional components are described to illustrate the wide variety of possible exemplary embodiments of the inventive concept.

When a single device or article is described herein, it will be readily apparent that more than one device/article (whether or not they cooperate) may be used in place of a single device/article. Similarly, where more than one device or article is described herein (whether or not they cooperate), it will be readily apparent that a single device/article may be used in place of the more than one device or article, or a different number of devices/articles may be used instead of the shown number of devices or articles. The functionality and/or features of a device may be alternatively embodied by one or more other devices which are not explicitly described as having such functionality/features. Thus, other exemplary embodiments of the inventive concept need not include the device itself.

The illustrated operations of FIG. 3, FIG. 4, and FIG. 5 show certain events or operations occurring in a certain order. In exemplary embodiments of the inventive concept, certain operations may be performed in a different order, modified, or removed. Moreover, operations may be added to the above described logic and still conform to the described exemplary embodiments. Further, operations described herein may occur sequentially or certain operations may be processed in parallel. Yet further, operations may be performed by a single processing unit or by distributed processing units.

It should be appreciated by those skilled in the art that any block diagrams herein represent conceptual views of illustrative systems embodying the principles of the present subject matter. Similarly, it will be appreciated that any flow charts, flow diagrams, state transition diagrams, pseudo code, and the like represent various processes which may be substantially represented in a computer readable medium and executed by a computer or processor, whether or not such a computer or processor is explicitly shown.

While the inventive concept has been shown and described with reference to exemplary embodiments thereof, it will be apparent to those of ordinary skill in the art that various changes in form and details may be made thereto without departing from the spirit and scope of the inventive concept as set forth by the following claims.

We claim:

1. A test device for a multi-lane transmitting apparatus, comprising:
   a signal generator circuit configured to generate first parallel bits with a predefined phase, and provide the first parallel bits to a plurality of lanes of the multi-lane transmitting apparatus;
   a comparator circuit configured to compare second parallel bits output from the multi-lane transmitting apparatus with the first parallel bits, and determine pass lanes and fail lanes from among the plurality of lanes based on the comparison result;
   a central circuit configured to determine whether a number of the fail lanes is less than a threshold; and
   an extrapolator circuit configured to calibrate the fail lanes.

2. The test device of claim 1, wherein:
   the extrapolator circuit is further configured to calibrate the fail lanes, when the number of the fail lanes is less than the threshold.

3. The test device of claim 2, wherein,
   the signal generator circuit is further configured to generate the first parallel bits with a second phase, when the number of the fail lanes is greater than or equal to the threshold.

4. The test device of claim 3, wherein,
   the comparator circuit is further configured to determine a final phase where a number of the pass lanes is maximized.

5. The test device of claim 2, wherein,
   the extrapolator circuit is further configured to delay-calibrate the fail lanes within a predetermined delay range.

6. The test device of claim 5, further comprising:
   an output port connected to a notification circuit,
   wherein, if the fail lanes are correctly delay-calibrated, the output port is configured to notify a pass result via the notification circuit.

7. The test device of claim 3, wherein, the predefined phase and the second phase range from 0° to 360°.

8. The test device of claim 1, wherein, the signal generator circuit and the extrapolator circuit are configured between two lanes of the plurality of lanes, and
   a deserializer circuit of the multi-lane transmitting apparatus is configured between the two lanes of the plurality of lanes to convert the first parallel bits, which are serialized, to the second parallel bits.

9. The test device of claim 8, further comprising:
   a switching circuit configured to connect the two lanes to the deserializer circuit.

10. The test device of claim 4, wherein,
    the extrapolator circuit is further configured to provide the final phase to the plurality of lanes.

11. A multi-lane transmitting apparatus comprising:
    a plurality of lanes, wherein each lane of the plurality of lanes comprises a serializer circuit configured to convert parallel bits to serial bits;
    a plurality of deserializer circuits configured to convert the serial bits to the parallel bits; and
    a test circuit including:
    a signal generator circuit configured to generate first parallel bits with a predefined phase, and provide the first parallel bits to the plurality of lanes;
    a comparator circuit configured to compare second parallel bits output from the plurality of deserializer circuits with the first parallel bits, and determine pass lanes and fail lanes from among the plurality of lanes based on the comparison result; and
    an extrapolator circuit configured to calibrate the fail lanes.

12. The multi-lane transmitting apparatus of claim 11, wherein,
    the test circuit further includes a central circuit configured to determine whether a number of the fail lanes is less than a threshold, and
    the extrapolator circuit is further configured to calibrate the fail lanes, when the number of the fail lanes is less than the threshold.

13. The multi-lane transmitting apparatus of claim 12, wherein,
    the signal generator circuit is further configured to generate the first parallel bits with a second phase, when the number of the fail lanes is greater than or equal to the threshold.

14. The multi-lane transmitting apparatus of claim 13, wherein,
    the comparator circuit is further configured to determine a final phase where a number of the pass lanes is maximized.

15. The multi-lane transmitting apparatus of claim 12, wherein,
    the extrapolator circuit is further configured to delay-calibrate the fail lanes within a predetermined delay range.

16. The multi-lane transmitting apparatus of claim 15, further comprising:
    a notification circuit,
    wherein, if the fail lanes are correctly delay-calibrated, the notification circuit is configured to notify a pass result.

17. The multi-lane transmitting apparatus of claim 13, wherein, the predefined phase and the second phase range from 0° to 360°.

18. The multi-lane transmitting apparatus of claim 11, further comprising:
   a switching circuit configured between the plurality of lanes and the plurality of deserializer circuits.

19. The multi-lane transmitting apparatus of claim 14, wherein,
   the extrapolator circuit is further configured to provide the final phase to the plurality of lanes.

20. A method for testing a multi-lane transmitting apparatus, comprising:
   generating first parallel bits with a predefined phase;
   providing the first parallel bits to a plurality of lanes of the multi-lane transmitting apparatus;
   comparing second parallel bits output from the multi-lane transmitting apparatus with the first parallel bits to generate a comparison result;
   determining pass lanes and fail lanes from among the plurality of lanes based on the comparison result;
   determining whether a number of the fail lanes is less than a threshold value; wherein when the number of the fail lanes is less than the threshold value, the multi-lane transmitting apparatus performs a delayed calibration; and
   calibrating the fail lanes.

* * * * *